(12) United States Patent
Arisumi et al.

(10) Patent No.: US 7,514,338 B2
(45) Date of Patent: Apr. 7, 2009

(54) METHOD OF MANUFACTURING A SEMICONDUCTOR DEVICE

(75) Inventors: Osamu Arisumi, Yokohama (JP); Masahiro Kiyotoshi, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 358 days.

(21) Appl. No.: 11/544,747

(22) Filed: Oct. 10, 2006

(65) Prior Publication Data
US 2007/0166951 A1    Jul. 19, 2007

(30) Foreign Application Priority Data
Jan. 17, 2006   (JP)  .............................. 2006-009031

(51) Int. Cl.
*H01L 21/76* (2006.01)

(52) U.S. Cl. .................. 438/424; 438/435; 438/437; 438/781; 438/790

(58) Field of Classification Search ................ 438/424, 438/435, 437, 780–782, 790
See application file for complete search history.

(56) References Cited

U.S. PATENT DOCUMENTS

| | | | |
|---|---|---|---|
| 6,566,229 B2 * | 5/2003 | Hong et al. ................. | 438/435 |
| 6,767,641 B1 * | 7/2004 | Shimizu et al. ............. | 428/446 |
| 7,238,587 B2 * | 7/2007 | Hoshi et al. ................. | 438/424 |
| 2005/0170608 A1 | 8/2005 | Kiyotoshi et al. | |
| 2006/0246684 A1 * | 11/2006 | Hoshi et al. ................. | 438/427 |
| 2007/0231484 A1 * | 10/2007 | Hishiya et al. ........... | 427/248.1 |

FOREIGN PATENT DOCUMENTS

JP   2003-258082   9/2003

OTHER PUBLICATIONS

Arisumi, O. et al., "Semiconductor Device and Method of Manufacturing Same," U.S. Appl. No. 11/227,252, filed on Sep. 16, 2005.

* cited by examiner

*Primary Examiner*—M. Wilczewski
*Assistant Examiner*—Toniae M Thomas
(74) *Attorney, Agent, or Firm*—Finnegan, Henderson, Farabow, Garrett & Dunner, L.L.P.

(57) ABSTRACT

A method of manufacturing a semiconductor device, includes preparing a work piece having a trench on its main surface side, forming a polymer film containing a polymer containing silicon, hydrogen and nitrogen on the main surface of the work piece, holding the work piece with the polymer film in a first atmosphere, which contains oxygen, and whose oxygen partial pressure is set in a range of 16 to 48 Torr, oxidizing the polymer film in a second atmosphere containing water vapor to form an oxide film containing a silicon oxide as a main component, after holding the work piece in the first atmosphere, and removing an upper portion of the oxide film to remain a lower portion of the oxide film in the trench.

15 Claims, 6 Drawing Sheets

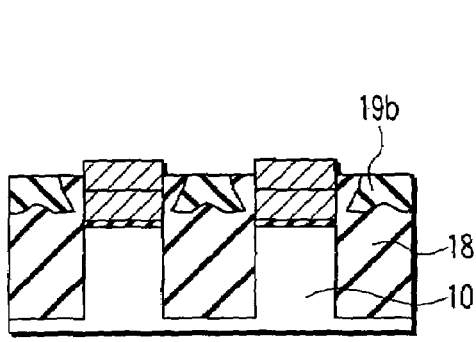
F I G. 14
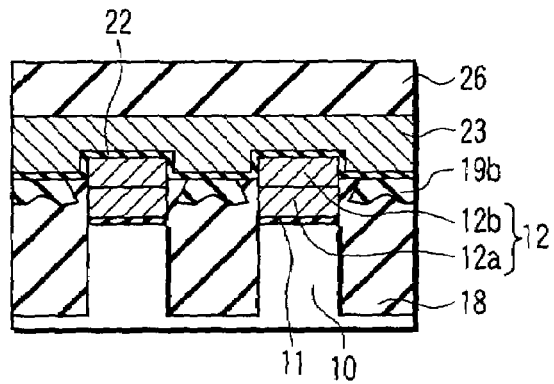
F I G. 15
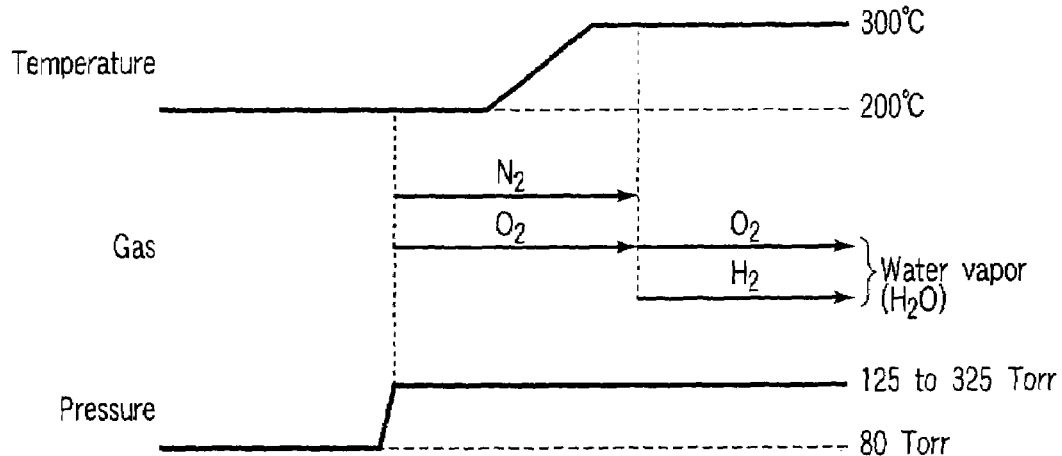
F I G. 16
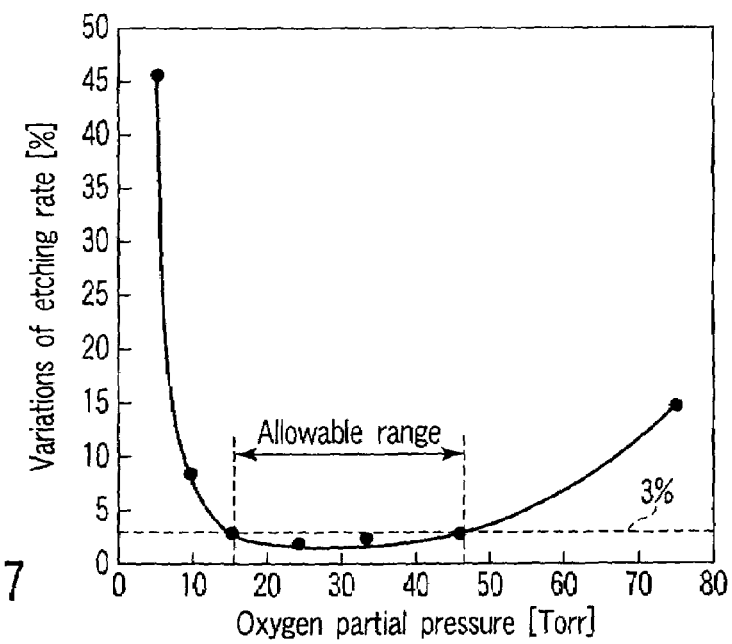
F I G. 17

METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2006-009031, filed Jan. 17, 2006, the entire contents of which are incorporated herein by reference.

BACKGROUND OF THE INVENTION

1. Field of the Invention

The present invention relates to a method of manufacturing a semiconductor device.

2. Description of the Related Art

With an advance in scale-down of semiconductor devices, it is difficult to securely fill an isolation trench with an insulating film. The aspect ratio (trench depth/trench width) of the isolation trench is high in a NAND type flash memory in particular. For this reason, it is very difficult to fill the isolation trench using only silicon oxide film (referred to as CVD silicon oxide film, hereinafter) formed by CVD (chemical vapor deposition).

In order to solve the foregoing problem, a method of using perhydrosilazane polymer (referred to as polysilazane) has been proposed (e.g., see JPN. PAT. APPLN. KOKAI Publication No. 2003-258082). Specifically, a polysilazane solution is coated, and thereafter, heat treatments such as a bake treatment (baking), cure treatment (curing) and densify treatment (densifying) are carried out. In this way, a silicon oxide film ($SiO_2$ film) is obtained. The silicon oxide film formed using polysilazane is hereinafter referred to as a polysilazane silicon oxide film, for convenience. For example, a stacked film of CVD silicon oxide film and polysilazane silicon oxide film is used as an isolation insulating film. By doing so, an isolation trench having a high aspect ratio can be filled with an isolation insulating film.

However, if the polysilazane silicon oxide film is used as an isolation insulating film, the polysilazane film is not sufficiently converted into the $SiO_2$ film; for this reason, the following problem arises.

Usually, in a NAND type flash memory, the isolation insulating film is formed, and thereafter, it is etched back thereby controlling the height of the isolation insulating film in a isolation trench. However, if the polysilazane film is not sufficiently converted into the $SiO_2$ film, variations occur in the etching depth. For example, oxygen is not sufficiently supplied in a portion having a narrow trench width; for this reason, the polysilazane film is not sufficiently converted into the $SiO_2$ film. As a result, the etching rate becomes high in the portion having a narrow trench width. Thus, the etching depth increases in the portion having a narrow trench width as compared with a portion having a wide trench width.

As described above, when the insulating film is formed in the trench, variations have conventionally occurred in the etching rate. For this reason, it is difficult to accurately control the etching depth.

BRIEF SUMMARY OF THE INVENTION

According to an aspect of the present invention, there is provided a method of manufacturing a semiconductor device, comprising: preparing a work piece having a trench on its main surface side; forming a polymer film containing a polymer containing silicon, hydrogen and nitrogen on the main surface of the work piece; holding the work piece with the polymer film in a first atmosphere, which contains oxygen, and whose oxygen partial pressure is set in a range of 16 to 48 Torr; oxidizing the polymer film in a second atmosphere containing water vapor to form an oxide film containing a silicon oxide as a main component, after holding the work piece in the first atmosphere; and removing an upper portion of the oxide film to remain a lower portion of the oxide film in the trench.

BRIEF DESCRIPTION OF THE SEVERAL VIEWS OF THE DRAWING

FIG. 5 to FIG. 15 are cross-sectional views to explain a method of manufacturing the semiconductor device according to first and second embodiments of the present invention;

FIG. 16 is a view to explain the heat treatment sequence according to the first embodiment of the present invention;

FIG. 17 is a graph to explain the relationship between oxygen partial pressure and variations of etching rate;

DETAILED DESCRIPTION OF THE INVENTION

Embodiments of the present invention will be described below with reference to the accompanying drawings.

First Embodiment

An electrically erasable non-volatile semiconductor memory, that is, NAND type flash memory is given below as one example of a semiconductor device.

Figure 1:
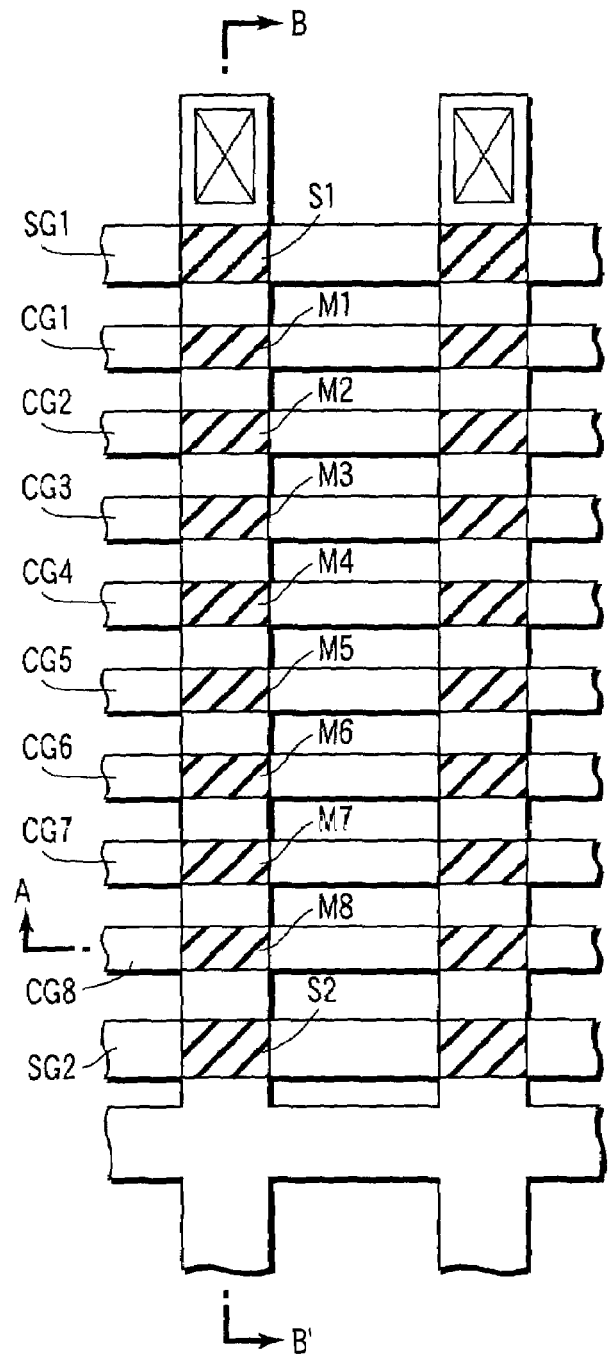
FIG. 1 is a plan view schematically showing the configuration of a semiconductor device according to first and second embodiments of the present invention.
Figure 2:
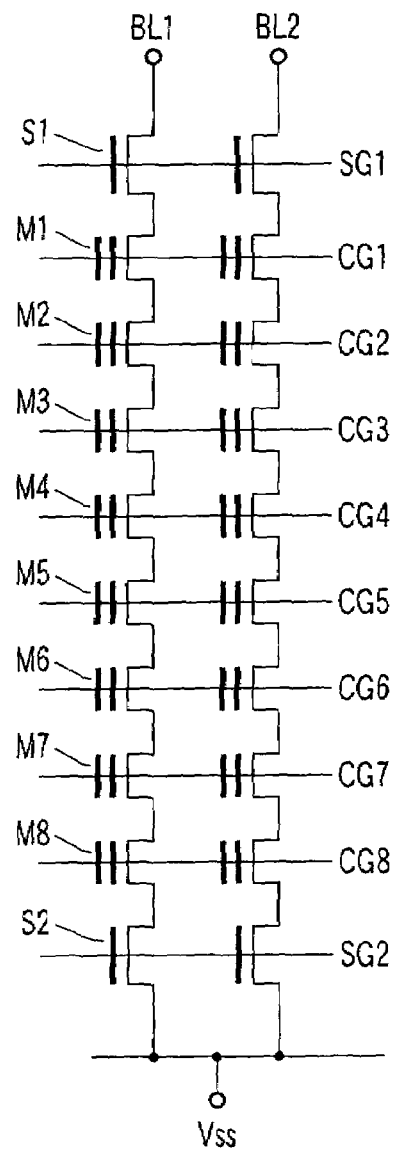
FIG. 2 is a view showing an equivalent circuit of the semiconductor device according to first and second embodiments of the present invention.

FIG. 1 is a top plan view schematically showing the configuration of a NAND type flash memory according to this embodiment (no bit line is shown in FIG. 1). FIG. 2 is an equivalent circuit diagram having the configuration shown in FIG. 1.

As shown in FIG. 1 and FIG. 2, a NAND cell unit is configured in a manner wherein serial-connected memory cells M1 to M8 are provided between select transistors S1 and S2. The select transistors S and S2 are connected with select gate lines SG1 and SG2, respectively. Memory cells M1 to M8 are connected with control gate lines (word lines) CG1 to CG8, respectively. The select transistor S1 is connected with bit lines BL1 and BL2. This embodiment has explained about the case where the memory cell is eight (8); however, the number of memory cells is not limited to eight (8).

Figure 3:
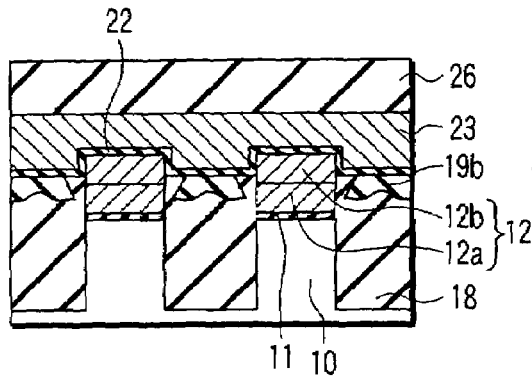
FIG. 3 is a cross-sectional view schematically showing the structure of a semiconductor device according to first and second embodiments of the present invention.
Figure 4:
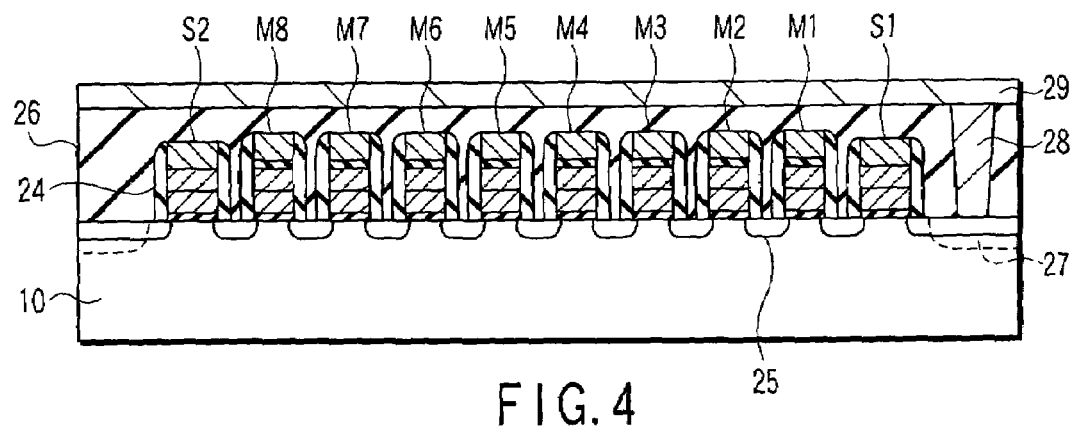
FIG. 4 is a cross-sectional view schematically showing the structure of a semiconductor device according to first and second embodiments of the present invention.
Figure 6:
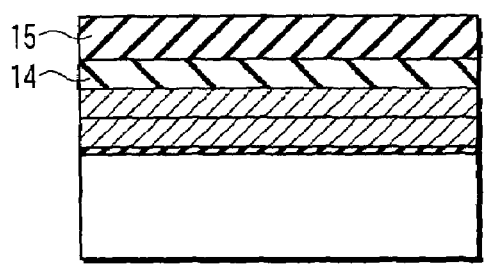

FIG. 3 is a cross-sectional view (in the word line direction) taken along the line A-A' of FIG. 1. FIG. 4 is a cross-sectional view (in the bit line direction) taken along the line B-B' of FIG. 1.

As illustrated in FIG. 3 and FIG. 4, select transistors S1, S2 and memory cells M1 to M8 are formed on a silicon substrate (semiconductor substrate) 10.

Each of memory cells M1 to M8 includes the following films. One of these films is a tunnel insulating film (first gate insulating film) 11 formed on the silicon substrate 10. Another is a floating gate electrode film (first gate electrode film) 12 formed of polysilicon films 12a and 12b. Another is an inter-electrode insulating film (second gate insulating film) 22 formed of ONO (oxide/nitride/oxide) film. Another is a control gate electrode film (second gate electrode film) 23. Select transistors S1 and S2 each includes a gate insulating film 11 formed on the silicon substrate 10, and a gate electrode formed of polysilicon films 12a, 12b and control gate electrode film 23. The sidewalls of select transistors S1, S2 and memory cells M1 to M8 are each formed with a sidewall spacer 24. A source/drain diffusion layer 25 is formed between memory cells adjacent to each other in the bit line direction.

An isolation insulating portion mainly containing a silicon oxide is formed between NAND cell units adjacent to each other in the word line direction. The isolation insulating portion is formed of silicon oxide films given below. One is a silicon oxide film 18 (CVD silicon oxide film: lower oxide film) formed using CVD. Another is a silicon oxide film 19b (polysilazane silicon oxide film: oxide film) obtained from perhydrosilazane polymer (polysilazane).

The foregoing select transistors and memory cells are covered with an interlayer insulating film 26. The surface region of the silicon substrate 10 is formed with a high-concentration diffusion layer 27. The high-concentration diffusion layer 27 is connected with a bit line 29 via a contact plug 28.

The method of manufacturing the foregoing NAND type flash memory will be explained below with reference to FIG. 5 to FIG. 15. FIG. 5 to FIG. 15 corresponds to a cross section taken along the line A-A' of FIG. 1.

Figure 5:
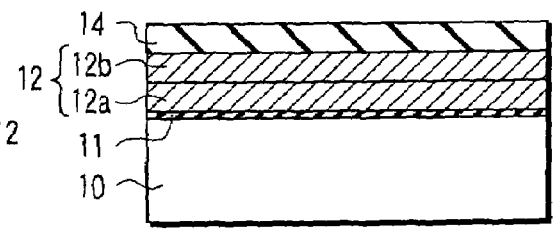

As shown in FIG. 5, a silicon oxide film (SiO$_2$ film) having a thickness of about 10 nm is formed as a tunnel insulating film 11 on the silicon substrate (semiconductor substrate) 10. Polysilicon films 12a and 12b having the total thickness of about 150 nm are formed as a floating gate electrode film 12 on the tunnel insulating film 11. A silicon nitride film (Si$_3$N$_4$ film) 14 having a thickness of about 100 nm is further formed on the polysilicon film 12b. Thereafter, a mask film 15 is formed on the silicon nitride film 14, as seen from FIG. 6.

Figure 7:
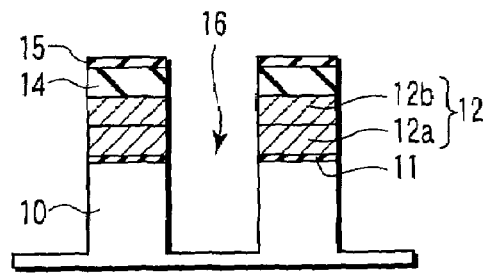

As illustrated in FIG. 7, the mask film 15 is patterned. Thereafter, the foregoing silicon nitride film 14, floating gate electrode film 12, tunnel insulating film 11 and silicon substrate 10 are patterned by means of RIE (reactive ion etching) using the patterned mask film 15 as a mask. By doing so, an isolation trench 16 for STI (shallow trench isolation) having a depth of about 450 nm is formed.

Although no illustration is given, after the process of FIG. 7, the following process may be given. Specifically, the surface of the isolation trench 16 may be oxidized using normal thermal oxidation to form a thermal oxide film having a thickness of about 3 nm. The thermal oxide film serves to protect an exposed portion of the edge of the tunnel insulating film 11. Moreover, the surface of the isolation trench 16 may be formed with an oxide film using radical oxidation. The radical oxidization is used, and thereby, a uniform oxide film can be formed without depending on silicon plane orientation. In addition, the side portion of the silicon nitride film 14 may be slightly oxidized.

Figure 8:
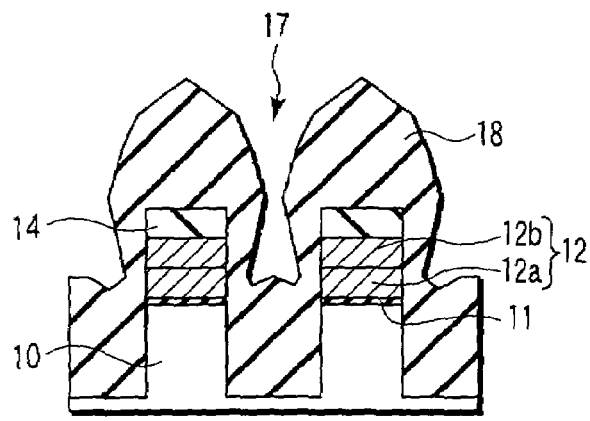

As depicted in FIG. 8, a CVD silicon oxide film 18 (lower oxide film) is deposited on the entire surface of the structure obtained in the process of FIG. 7 using HDP (high density plasma)-CVD (chemical vapor deposition). In this case, the isolation trench 16 is not fully filled with the CVD silicon oxide film 18, and the CVD silicon oxide film 18 has a recess 17 based on the isolation trench 16.

Figure 9:
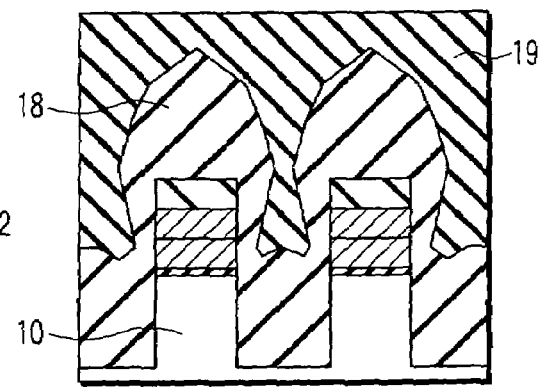

As seen from FIG. 9, a perhydrosilazane polymer solution layer (polysilazane solution layer) 19 is formed on a work piece obtained by the process of FIG. 8 as a polymer solution layer containing polymer containing silicon hydrogen and nitrogen. Specifically, a polysilazane solution is coated on the CVD silicon oxide film 18 using spin coating so that the thickness on the flat surface becomes 600 nm.

Figure 10:
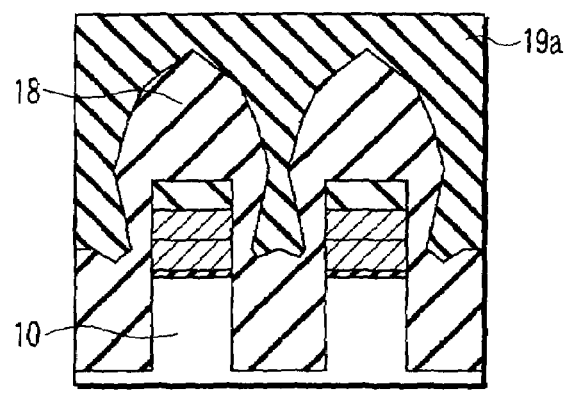

As shown in FIG. 10, solvent contained in the polysilazane solution layer 19 is vaporized using a bake treatment (baking) to form a perhydrosilazane polymer film (polysilazane film) 19a. The bake treatment is carried out under the following condition, that is, at temperature of 150° C. for three minutes. The recess 17 of the CVD silicon oxide film 18 is fully filled with the polysilazane film 19a.

Figure 11:
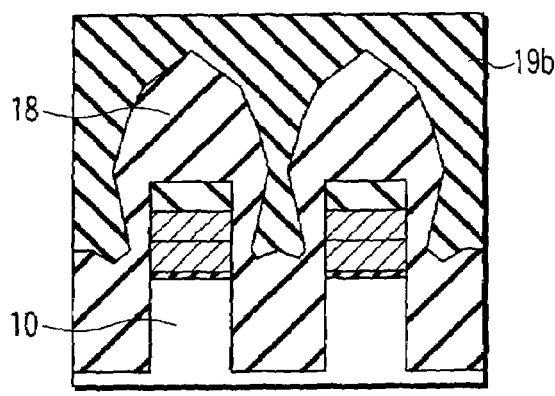

As illustrated in FIG. 11, cure treatment (curing) is carried out. The cure treatment is carried out, and thereby, polysilazane is converted into a silicon oxide (SiO$_2$). By the foregoing process, a polysilazane silicon oxide film 19b is formed as an oxide film containing a silicon oxide as a main component. Specifically, high temperature heat treatment is carried out under water vapor atmosphere. The following reaction is given.

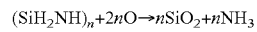

$$(SiH_2NH)_n + 2nO \rightarrow nSiO_2 + nNH_3$$

In other words, polysilazane reacts with oxygen (O) or OH generated by decomposition of water vapor (H$_2$O+O$_2$). By the foregoing reaction, SiO$_2$ (silicon oxide: silica) and NH$_3$ (ammonia) are generated. Incidentally, the surface of element region is converted with the silicon nitride film 14; therefore, it is not oxidized.

The details of the cure treatment sequence will be explained below with reference to FIG. 16.

First, a quartz tube is prepared as a cure treatment reactor. Then, a work piece formed with the polysilazane film 19a is carried in the quartz tube. Evacuation is carried out until the internal pressure of the reactor reaches about several tens of mTorr. Thereafter, the internal pressure of the reactor is controlled to about several tens of Torr. The temperature of the work piece is controlled to 200° C.

Mixed gas of oxygen (O$_2$) and nitrogen (N$_2$) is introduced into the reactor while the temperature of the work piece is kept at 200° C. In this case, the internal pressure of the reactor, that is, pressure of the O$_2$/N$_2$ mixed gas atmosphere (first atmosphere) is set in a range of 125 to 325 Torr. Moreover, the flow rate of O$_2$ and N$_2$ is controlled so that an oxygen partial pressure of the mixed gas atmosphere is set to a desired pressure, that is, in a range of 16 to 48 Torr. In addition, a nitrogen partial pressure is set to become higher than the oxygen partial pressure. For example, the following condition is given.

Pressure of O$_2$/N$_2$ mixed gas atmosphere:

325 Torr(s)
   O$_2$ flow rate: 0.25 sLM
   N$_2$ flow rate: 4.75 sLM
   O$_2$ partial pressure: 16 Torr(s)

The oxygen partial pressure is set in a range of 16 to 48 Torr, and thereby, variations of etching are prevented, as described later. The work piece is held in the $O_2/N_2$ mixed gas atmosphere set in the manner described above, for five minutes. The temperature of the work piece is increased to 300° C. while the oxygen partial pressure of the $O_2/N_2$ mixed gas atmosphere is maintained.

The temperature of the work piece is stable within a range ±2° C. from 300° C., and thereafter, the supply of $N_2$ gas is stopped while the supply of hydrogen gas ($H_2$ gas) is started. By doing so, the $O_2$ gas reacts with the $H_2$ gas to generate water vapor (steam). Specifically, the reaction of the $O_2$ gas with the $H_2$ gas is taken in a reaction unit (WVG: Water Vapor Generator) arranged on the front side of the introduction portion of the reactor (quartz tube). Incidentally, the foregoing $O_2$ gas and $H_2$ gas may be introduced into the reactor, and then, water vapor may be formed in the reactor.

In a water vapor atmosphere (second atmosphere) thus obtained, the polysilazane film 19a is oxidized. The oxidization temperature is 300° C. as described above, and the oxidization time is about 30 minutes, for example. Water vapor oxidization is given, and thereby, a polysilazane silicon oxide film 19b is formed.

A densify treatment is carried out with respect to the polysilazane silicon oxide film 19b subjected to the foregoing cure treatment. Heat treatment at temperature of about 850° C. is carried out in an inert gas atmosphere or oxidizing gas atmosphere. By doing so, $NH_3$ and $H_2O$ remaining in the polysilazane silicon oxide film 19b are released; therefore, a silicon oxide film having a higher density is obtained. In also case, the surface of element region is covered with the silicon nitride film 14; therefore, it is not oxidized. The foregoing densify treatment may be carried out using a normal furnace or RTA (rapid thermal annealing). If the RTA is used, heat treatment is carried out at temperature of 900° C. for 20 seconds, for example.

Figure 12:
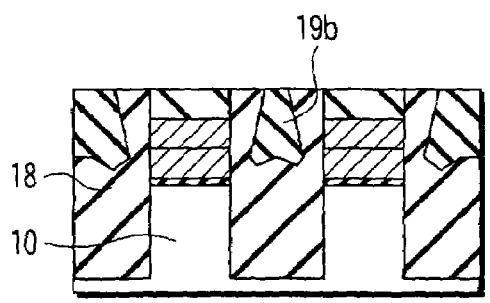

As depicted in FIG. 12, the foregoing CVD silicon oxide film 18 and polysilazane silicon oxide film 19b are planarized by means of CMP (chemical mechanical polishing) using the silicon nitride film 14 as a stopper. In this case, the foregoing CMP is carried out using colloidal silica-based abrasive. By doing so, a ratio of the polishing rate of the silicon nitride film 14 to that of the foregoing CVD silicon oxide film 18 and polysilazane silicon oxide film 19b is set to 50 or more.

Figure 13:
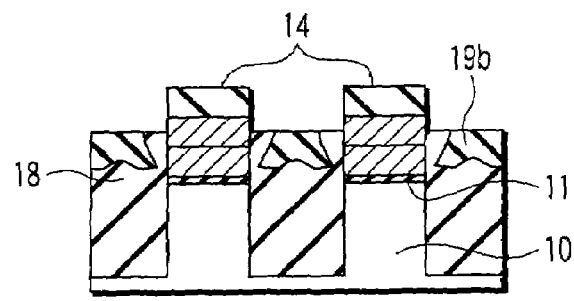

As seen from FIG. 13, the foregoing CVD silicon oxide film 18 and polysilazane silicon oxide film 19b are etched back by hydrofluoric acid (HF)-based etching solution. As a result, upper portion of the CVD silicon oxide film 18 and polysilazane silicon oxide film 19b is removed. Thus, the lower portion remains in the isolation trench. The top surface of the lower portion becomes lower than the uppermost portion of the isolation trench.

As already described, according to this embodiment, the following settings are given. That is, the oxygen partial pressure of the $O_2/N_2$ mixed gas atmosphere is set in a range of 16 to 48 Torr before the polysilazane film 19a is converted into the polysilazane silicon oxide film 19b using water vapor oxidization. Therefore, variations of etching are prevented. In other words, uniform etch-back treatment is carried out without depending on the trench width of the isolation trench. Thus, the foregoing CVD silicon oxide film 18 and polysilazane silicon oxide film 19b remain having a desired uniform height in each isolation trench.

The etch-back treatment is carried out, and thereafter, densify treatment is carried out with respect to the CVD silicon oxide film 18 and the polysilazane silicon oxide film 19b. Specifically, high-temperature and long-time heat treatment is carried out in a $N_2$ gas atmosphere at temperature of 800° C. for one hour. By doing so, the polysilazane silicon oxide film 19b is sufficiently densified. If the densify treatment is carried out before etch-back treatment, the sufficiently densified polysilazane silicon oxide film 19b is etched back; therefore, variations of etching is prevented. However, in this case, the polysilazane silicon oxide film 19b is sufficiently hardened by high-temperature and long-time heat treatment. For this reason, the etching rate of the etch-back treatment becomes considerably decrease. As a result, long-time etch-back is required, and this is a factor causing the following problems. Specifically, one is a problem that the floating gate electrode film 12 receives damages. Another is a problem that peel-off occurs at the interface between CVD silicon oxide film 18 and polysilazane silicon oxide film 19b. Therefore, the foregoing high-temperature and long-time densify treatment should be carried out after etch-back treatment.

As shown in FIG. 14, the silicon nitride film 14 is removed using hot phosphoric acid as an etching solution.

As illustrated in FIG. 15, the surface of floating gate electrode film 12 and the surface of isolation portion formed of CVD silicon oxide film 18 and polysilazane silicon oxide film 19b are formed with an inter-electrode insulating film 22 formed of an ONO film. Then, a control gate electrode film 23 is formed on the inter-electrode insulating film 22. The following films, that is, tunnel insulating film 11, floating gate electrode film 12, inter-electrode insulating film 22 and control gate electrode film 23 are patterned in a direction vertical to an extending direction of the isolation trench. By doing so, the gate structure formed of the films 11, 12, 22 and 23 described above is obtained. A source/drain diffusion layer (not shown) is formed, and thereafter, an interlayer insulating film 26 is formed.

Although no illustration relevant to the process after that is given, contacts and interconnects are formed to form a NAND type flash memory.

FIG. 17 is a graph showing measured results relevant to the relationship between oxygen partial pressure of $O_2/N_2$ mixed gas atmosphere before curing treatment (water vapor oxidization) and variations of etching rate in a wafer in etch-back treatment. An identical wafer formed with isolation trenches having several trench widths is used as a measurement sample. The minimum value of the trench width is about 70 nm, and the maximum value thereof is about several tens of μM.

As seen from FIG. 17, when the oxygen partial pressure is lower than 16 Torr and higher than 48 Torr, the etching rate is largely variable in the identical wafer. Mainly, this is because the etching rate changes depending on the trench width. On the contrary, when the oxygen partial pressure is in a range of 16 to 48 Torr, variations of the etching rate are reduced to 3% or less. Therefore, the oxygen partial pressure is set in a range of 16 to 48 Torr, and thereby, variations of the etching rate are sufficiently prevented in the etch-back treatment. In other words, the height (upper surface position) of the isolation portion formed by etch-back treatment is made uniform in the identical wafer.

Figure 18:
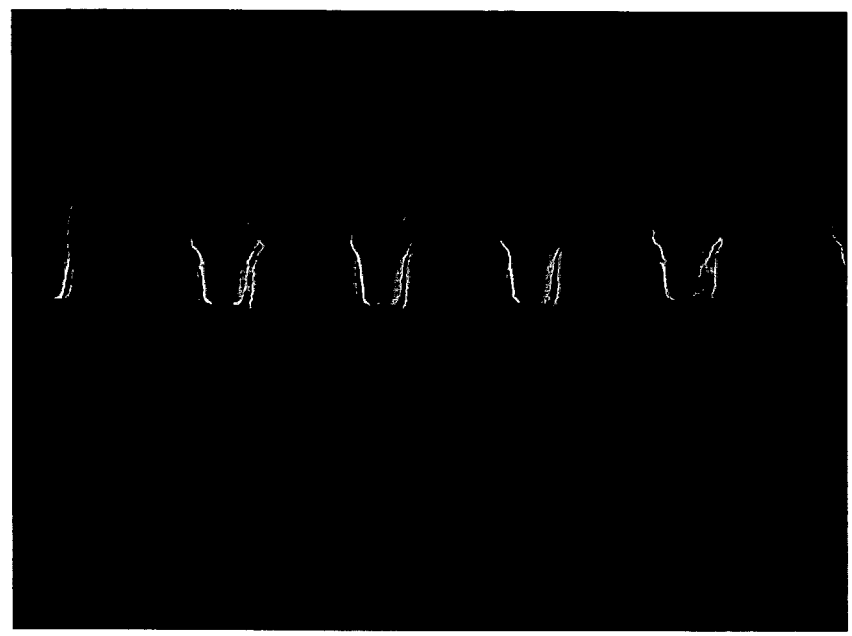
FIG. 18 is an electron microscope photograph showing the cross section of an etched-back sample according to the first embodiment of the present invention.
Figure 19:
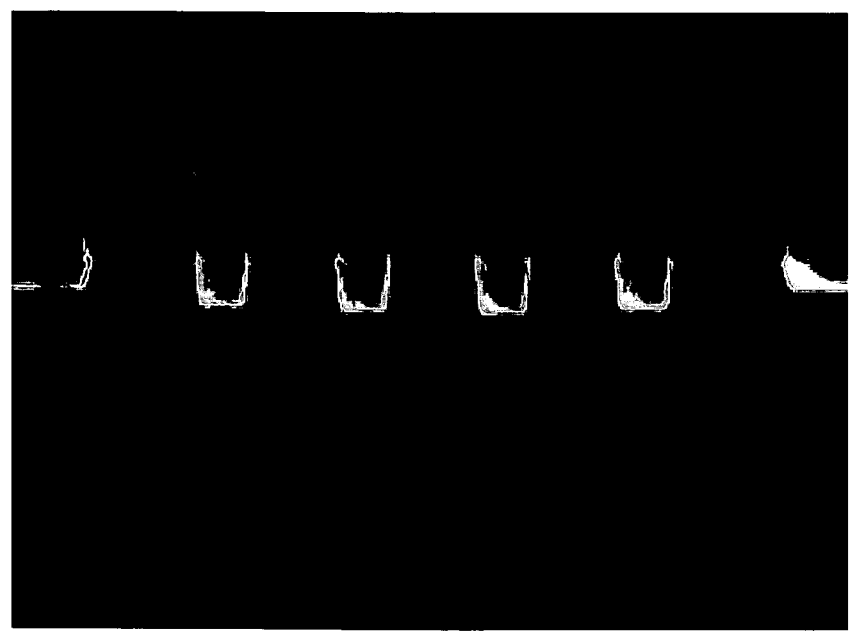
FIG. 19 is an electron microscope photograph showing the cross section of an etched-back sample given as a comparative example of the first embodiment of the present invention.

FIG. 18 and FIG. 19 are SEM photographs showing the cross section of an etched-back sample. FIG. 18 shows the case of using the method described in this embodiment. On the other hand, FIG. 19 shows the case of using the conventional method (the case where oxygen partial pressure is higher than 48 Torr). As seen from the comparison between FIG. 18 and FIG. 19, the height of the isolation portion changes depending on the trench width in the case of using the conventional method. On the contrary, the height of the isolation portion is made uniform in the case of using the method described in this embodiment.

If the oxygen partial pressure of the $O_2/N_2$ mixed gas atmosphere is set higher than 48 Torr, many particles were detected on the wafer. Therefore, the oxygen partial pressure is set to lower than 48 Torr, and thereby, the foregoing problem is solved.

According to this embodiment, the oxygen partial pressure of the $O_2/N_2$ mixed gas atmosphere is set in a range of 16 to 48 Torr before the cure treatment (water vapor oxidization) is carried out. By doing so, variations of the etching rate are prevented in the etch-back treatment. Thus, the height of the isolation portion is accurately controlled.

In non-volatile memory cells, a capacitance ratio (coupling ratio) of capacitance C1 based on the tunnel insulating film 11 and capacitance C2 based on the inter-electrode insulating film 22 is important. As seen from FIG. 15, the inter-electrode insulating film 22 is formed on the top and side of the floating gate electrode film 12. Thus, in order to improve the precision of the capacitance C2, it is important to accurately control the height of the top surface of the isolation insulating portion. The method described in the first embodiment is employed, and thereby, the height of the top surface of the isolation insulating portion is accurately controlled. Therefore, this serves to reduce variations of the capacitance ratio.

Second Embodiment

In the foregoing first embodiment, the pressure of the water vapor atmosphere is set constant in the cure treatment. According to the second embodiment, the pressure of the water vapor atmosphere is changed. The basic matters are the same as the first embodiment; therefore, the explanation about the matters described in the first embodiment is omitted.

Figure 20:
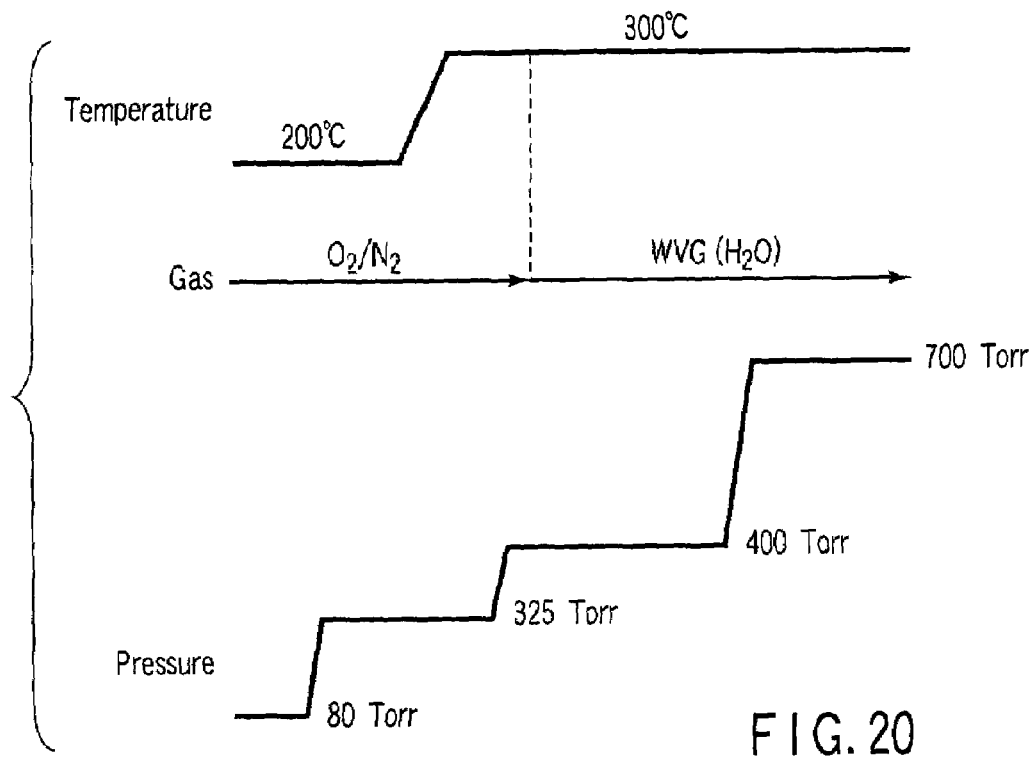
FIG. 20 is a view to explain the heat treatment sequence according to the second embodiment of the present invention.

The details of the cure treatment sequence of the second embodiment will be explained below with reference to FIG. 20.

The sequence before cure treatment (water vapor oxidization) is the same as the first embodiment. In other words, the oxygen partial pressure of the $O_2/N_2$ mixed gas atmosphere is set to a desired pressure in a range of 16 to 48 Torr before the water vapor oxidation treatment is carried out.

In water vapor oxidization, a pressure of water vapor atmosphere (internal pressure of reactor) is set to 400 Torr (first pressure), and thereafter, heat treatment is carried out for five minutes. Then, the pressure of water vapor atmosphere is increased from 400 Torr to 700 Torr (second pressure), and thereafter, heat treatment is carried out for 25 minutes. Preferably, the first pressure is set in a range of 325 to 400 Torr; on the other hand, the second pressure is set in a range of 700 to 760 Torr.

As described above, the pressure of water vapor atmosphere is increased from the first pressure to the second pressure in water vapor oxidization. By doing so, the polysilazane film is effectively converted into polysilazane silicon oxide film. Specifically, the residual amount of silanol (Si—OH) is reduced. As a result, a shrinkage of the polysilazane silicon oxide film is prevented in heat treatment such as densify treatment, and the stress can be reduced.

Figure 21:
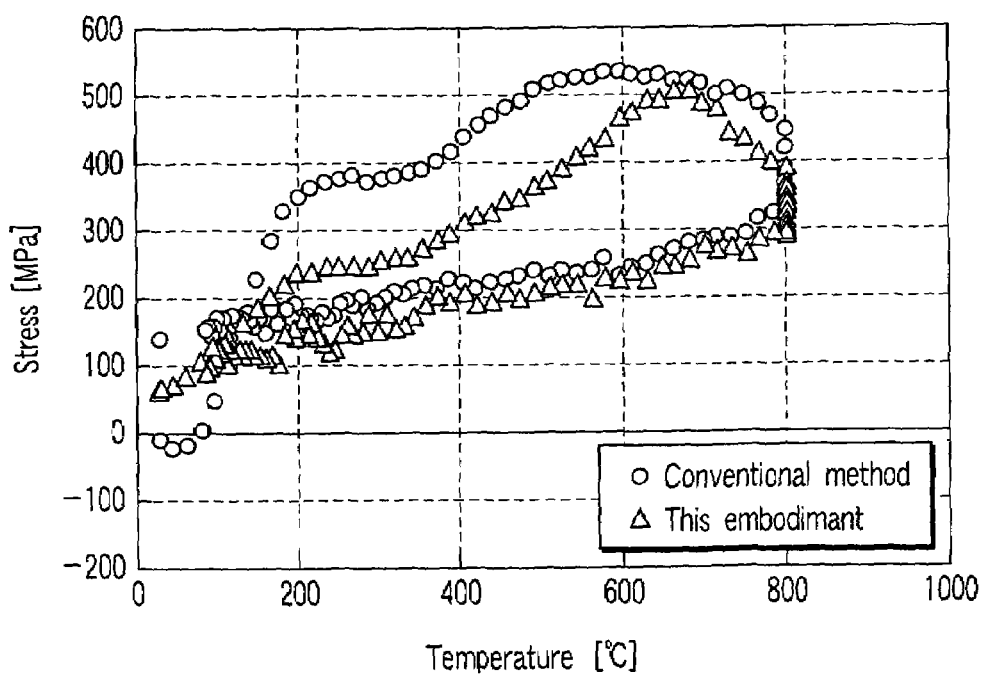
FIG. 21 is a graph to explain heat history characteristic of stress according to the second embodiment of the present invention.

FIG. 21 is a graph showing the measured result of the foregoing effect of reducing stress. Stress was calculated using samples obtained in a manner that cure treatment was carried out with respect to a polysilazane film formed on a Si wafer. Specifically, temperature rise up and down of the samples were made using an apparatus capable of measuring a thermal history in a warp of the wafer. The temperature rise-up speed to 800° C. was set to 10° C./minute, and the hold time at the temperature 800° C. was set to 30 minutes. A stress value σ is determined from the following equation using the radius R of curvature estimated from the warp of wafer.

$$\sigma = [E/(1-\nu)] \times [h^2/(6 \times R \times t)]$$

Where,

ν: Poisson ratio of Si

E: Young's modulus of Si t: Thickness of polysilazane film subjected to cure treatment h: Thickness of Si wafer As seen from FIG. 21, the method described in this embodiment is employed, and thereby, the peak stress value is reduced about 50 MPa and the thermal budget at temperature rise up is reduced about 20%, as compared with the case of employing the conventional method.

In the second embodiment, the oxygen partial pressure of the $O_2/N_2$ mixed gas atmosphere is set in a range of 16 to 48 Torr before the cure treatment (water vapor oxidization) is carried out. By doing so, variations of the etching rate are prevented as in the first embodiment. In addition, in the second embodiment, the pressure of water vapor atmosphere is increased from the first pressure to the second pressure in water vapor oxidization. By doing so, the shrinkage of the polysilazane silicon oxide film is prevented, and the stress can be reduced. Therefore, it is possible to solve the problem that peel-off and defect occur.

In the foregoing first and second embodiments, polysilazane is used as a polymer containing silicon, hydrogen and nitrogen. The same method as the forgoing embodiments is applicable to any other polymers so long as they are converted into a silicon oxide by heat treatment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

preparing a work piece having a trench on its main surface side;

forming a polymer film containing a polymer containing silicon, hydrogen and nitrogen on the main surface of the work piece;

holding the work piece with the polymer film in a first atmosphere, which contains oxygen, and whose oxygen partial pressure is set in a range of 16 to 48 Torr;

oxidizing the polymer film in a second atmosphere containing water vapor to form an oxide film containing a silicon oxide as a main component, after holding the work piece in the first atmosphere; and removing an upper portion of the oxide film to remain a lower portion of the oxide film in the trench.

2. The method according to claim 1, wherein the first atmosphere further contains nitrogen.

3. The method according to claim 2, wherein a nitrogen partial pressure in the first atmosphere is higher than the oxygen partial pressure.

4. The method according to claim 1, wherein the work piece is increased from a first temperature to a second temperature in the first atmosphere, and the polymer film is oxidized at the second temperature in the second atmosphere.

5. The method according to claim 1, wherein oxidizing the polymer film includes increasing a pressure of the second atmosphere from a first pressure to a second pressure.

6. The method according to claim 1, wherein the water vapor is generated by reacting oxygen with hydrogen.

7. The method according to claim 1, wherein forming the polymer film includes:
   coating a polymer solution containing the polymer on the main surface of the work piece; and
   vaporizing solvent of the polymer solution.

8. The method according to claim 1, wherein the polymer is a perhydrosilazane polymer.

9. The method according to claim 1, wherein the trench is previously formed with a lower oxide film, which contains a silicon oxide as a main component and has a recess based on the trench, and the recess is filled with the polymer film.

10. The method according to claim 9, wherein the lower oxide film is formed using CVD.

11. The method according to claim 1, wherein a top surface of the lower portion of the oxide film is lower than the uppermost portion of the trench.

12. The method according to claim 1, wherein the trench is an isolation trench.

13. The method according to claim 12, wherein the isolation trench is formed by patterning a semiconductor substrate, a first gate insulating film formed on the semiconductor substrate and a first gate electrode film formed on the first gate insulating film.

14. The method according to claim 13, wherein the lower portion of the oxide film is used as an isolation insulating portion, and said method further comprises:
   forming a second gate insulating film on the first gate electrode film and the isolation insulating portion; and
   forming a second gate electrode film on the second gate insulating film.

15. The method according to claim 1, wherein the semiconductor device includes a NAND type non-volatile memory or CMOS transistor.

* * * * *